(12) United States Patent
Pruijmboom et al.

(10) Patent No.: US 6,611,044 B2
(45) Date of Patent: *Aug. 26, 2003

(54) LATERAL BIPOLAR TRANSISTOR AND METHOD OF MAKING SAME

(75) Inventors: Armand Pruijmboom, Wijchen (NL); David M. Szmyd, Albuquerque, NM (US); Reinhard Germany Brock, Albuquerque, NM (US)

(73) Assignee: Koninklijke Philips Electronics N.V., Eindhoven (NL)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 38 days.

(21) Appl. No.: 09/383,816

(22) Filed: Aug. 26, 1999

(65) Prior Publication Data

US 2002/0030244 A1 Mar. 14, 2002

Related U.S. Application Data

(60) Provisional application No. 60/099,884, filed on Sep. 11, 1998.

(51) Int. Cl.[7] .................... H01L 27/082; H01L 27/102
(52) U.S. Cl. ................. 257/588; 257/557; 257/558; 257/561; 257/587; 257/591; 257/592; 438/339; 438/372; 438/373
(58) Field of Search ....................... 257/423, 575, 257/576, 511, 512, 525, 556–560, 561–562, 587, 588, 592, 593; 438/316, 325, 336, 564, 488, 491, 335, 338

(56) References Cited

U.S. PATENT DOCUMENTS 4,583,106 A * 4/1986 Anantha et al. .............. 357/35
5,083,180 A * 1/1992 Miura et al. .................. 357/43
5,132,234 A   7/1992 Kim et al. ..................... 437/31
5,134,082 A   7/1992 Kirchgessner ............... 437/31
5,187,109 A   2/1993 Cook et al. ................... 437/32
5,319,234 A   6/1994 Uga et al. .................... 257/369
5,347,156 A * 9/1994 Sakaue ........................ 257/575
5,387,553 A * 2/1995 Moksvold et al. ........... 437/32

(List continued on next page.)

FOREIGN PATENT DOCUMENTS

| DE | 19705302 | 9/1997 | ....... H01L/21/8249 |
| EP | 0435331 A2 | 7/1991 | |
| EP | 0495329 A2 | 7/1992 | ........... H01L/21/82 |
| EP | 0694972 A2 | 1/1996 | ........... H01L/27/06 |
| EP | 0746032 A2 | 12/1996 | ........... H01L/27/06 |
| EP | 0767499 A2 | 4/1997 | ......... H01L/29/732 |

OTHER PUBLICATIONS

"A Fully Complementary BiCMOS Technology for Sub–Hal–Micrometer Microprocessor Applications" by S.W. Sun et al, IEEE Trans. vol. 39, No. 12, Dec. 1992.
"A High Performance BIMCOS Process Featuring 40 GHz/ 21ps", by M. Kerber et al, IEEE, pp. 17.2.1–17.2.4.

Primary Examiner—Tom Thomas
Assistant Examiner—Donghee Kang
(74) Attorney, Agent, or Firm—Aaron Waxler

(57) ABSTRACT

A lateral bipolar transistor for an intergrated circuit is provided that maintains a high current gain and high frequency capability without sacrificing high Early voltage. More particularly, a lateral bipolar transistor is formed on an integrated circuit having both bipolar and CMOS devices, the lateral bipolar transistor being formed according to the BiCMOS method and without additional steps relative to formation of vertical bipolar devices if provided in the same area. Among other things, an integrated circuit is provided in which P well structures are provided in the collector regions of an LPNP that have been found to affect a significant increase in the product of the Early voltage and the current gain.

18 Claims, 7 Drawing Sheets

U.S. PATENT DOCUMENTS

| | | | |
|---|---|---|---|
| 5,405,790 A | | 4/1995 | Rahim et al. .................. 437/34 |
| 5,422,290 A | * | 6/1995 | Grubisch ..................... 437/34 |
| 5,508,551 A | * | 4/1996 | Deshazo ..................... 257/552 |
| 5,541,120 A | * | 7/1996 | Robinson et al. .............. 437/31 |
| 5,637,516 A | | 6/1997 | Muller ....................... 438/203 |
| 5,824,560 A | | 10/1998 | Van Der Wel et al. ....... 437/31 |

* cited by examiner

LATERAL BIPOLAR TRANSISTOR AND METHOD OF MAKING SAME

CROSS-REFERENCE TO RELATED APPLICATIONS

This application claims the benefit of U.S. Provisional Application No. 60/099,884, filed Sep. 11, 1998.

BACKGROUND OF THE INVENTION

1. Field of the Invention

The present invention relates to a lateral bipolar transistor for an integrated circuit and a method of manufacturing the lateral bipolar transistor, and, more particularly, to a bipolar and complementary MOS transistor (BiCMOS) circuit using the lateral bipolar transistor and its method of manufacture.

2. Description of the Related Art

BiCMOS circuits including high speed analog circuitry are in high demand for computer and communication applications. A conventional BiCMOS circuit has both bipolar transistors and MOS transistors and in a single circuit on a common substrate. MOS transistors are typically used in digital circuits while bipolar transistors are typically used in analog circuits, and a BiCMOS circuit combines and integrates these transistors in a common monolithic semiconductor structure. Accordingly, in fabricating BiCMOS circuits, the formation of the MOS transistors and bipolar transistors must be compatible to be integrated into a common process scheme. Moreover, to control production cost, time and complexity, there remains a constant need in the BiCMOS process field for new design approaches that limit and reduce the overall number of process steps.

Lateral bipolar type transistors are used in BiCMOS devices as they provide good linearity and they generally are amenable to high volume production. The lateral bipolar transistors generally involve three distinct semiconductor regions of alternating conductivities, e.g., PNP or NPN, which extend along a common surface region of a substrate so as to form a lateral PNP (LPNP) or lateral NPN (LNPN), respectively. A need exists for a process sequence that would accomodate formation of a lateral bipolar transistor (e.g., LPNPs) for a BiCMOS circuit in the same area otherwise defined for a vertical bipolar device (viz., a vertical NPN device) without requiring additional process steps compared to those required to form vertical bipolar devices in the BiCMOS process. It also would be desirable to reduce the lateral spacing between emitters and collectors in LPNPs of BiCMOS devices. Narrower spacing between emitters and collectors in LPNPs is conducive to increasing gain and frequency response in the devices.

Additionally, for analog circuits in general using bipolar transistors, the magnitude of the current gain, maximum operating frequency, and Early voltage properties generally provide an indication of the high speed capabilities of the circuitry. Moreover, larger values of the product of the beta ($\beta$) value (i.e., the current gain) of the transistor times the Early voltage also provides an indication of the high performance capabilities of the circuit. As known, a transistor's beta ($\beta$) value is the ratio of its output current ($I_C$) to its input current ($I_B$) determined while the transistor's collector-to-emitter voltage ($V_{CE}$) is held constant. The current gain of a transistor circuit corresponds identically to the transistor's beta ($\beta$) value for a common-emitter transistor circuit.

The Early effect phenomenon is also well known and it is based upon experimental observations that when the output characteristics curves, i.e., the plots of measured data of collector current versus collector voltage for different base current, of a bipolar transistor are extrapolated back to the point of zero collector current, that the curves all intersect at a common negative voltage. This voltage is the Early voltage, and it is typically represented as $V_A$. High Early voltage is desired in analog circuits to prevent drastic swings from occuring in the collector current.

However, an impediment in the past to improving the high speed performance of an analog circuit with lateral bipolar transistors has been a tradeoff relationship that exists between the Early voltage, on one hand, and the current gain or the operational frequency on the other. Namely, improvements (increases) provided in either current gain or Early voltage in prior bipolar transistor designs have tended to be accompanied by an offsetting reduction in the other property such that the net overall performance of the circuit was not significantly improved. For example, the product of current gain (or beta) times the Early voltage, as a measure of performance capability, would remain essentially the same in value because if one property was increased the other property would seesaw down a cancelling amount. Therefore, a need also exists for lateral bipolar transistor architecture permitting enhancements to be made to either the Early voltage or the current gain (or operational frequency) without the improvements being effectively cancelled out due to an offsetting reduction occuring in the other transistor property. In that way, a meaningful net improvement in circuit performance might be provided at the design level.

In any event, the prior art fails to satisfactorily address and meet one or more of the above-mentioned needs and problems associated with conventional semiconductor devices using lateral bipolar transistors in general and conventional BiCMOS technology in particular.

For instance, U.S. Pat. No. 5,187,109 describes a process for making BiCMOS integrated circuits which include a bipolar transistor and MOS transistors. The emitter and collector are located in the same active region with a remote base contact made to a buried N region. The emitter is formed by diffusion from a layer of P+ polycrystalline silicon, and the P+ polycrystalline layer also serves as the gates of the MOS transistors. The base region is located directly under an insulator which is covered by the P+ polycrystalline layer used to form the emitter. A P+ S/D of the PMOS is the collector, and it is self-aligned to the base. An emitter field plate is used that is self-aligned to the collector to minimize E-C capacitance. The device is isolated with a buried N connection to cathode. A polycrystalline layer is used to contact deep buried N regions, and a CMOS spacer is used to prevent a short to the anode. However, U.S. Pat. No. 5,187,109 fails to teach a lateral bipolar transistor architecture in which the current gain or Early voltage can be enhanced without sacrificing the other property in a proportional manner.

Sun, et al., *IEEE Transactrions on Electron Devices*, vol. 39, no. Dec. 12, 1992, pp. 2733–2739, and commonly assigned U.S. Pat. No. 5,824,560, describe BiCMOS process technology providing a gated lateral PNP with metal silicide contacts arranged on the surface of polysilicon electrodes and on adjacent P+ surface regions provided in the substrate, where conventional lateral insulation portions or oxide spacers are formed on the sides of the polysilicon electrodes before subsequent metal silicide processing is performed, and the oxide spacers laterally intervene and laterally space the polysilicon electrodes from the P+ surface regions, and hence increases the spacing between adjacent polysilicon electrodes. Therefore, the gain and frequency response in the devices described in the Sun et al. publication and the U.S. Pat. No. 5,824,560 patent can be expected to be non-optimal. Additionally, as with the U.S. Pat. No. 5,197,109 patent, the Sun et al. publication and the U.S. Pat. No. 5,824,560 patent also fail to teach a lateral bipolar transistor architecture in which the current gain or Early voltage can be favorably improved without sacrificing the other property in a proportional manner.

Consequently, a need has existed in the art for a lateral bipolar transistor architecture that would support and enable high performance, high speed BiCMOS circuits technology, and a methodology for assimilating the formation of such bipolar transistor architecture into a BiCMOS process without necessitating additional process steps. The present invention fulfills the above and other needs.

SUMMARY OF THE INVENTION

According to the present invention, a lateral bipolar transistor is provided that maintains a high current gain and high frequency capability without sacrificing high Early voltage. More particularly, a lateral bipolar transistor is formed on an integrated circuit having both bipolar and CMOS devices, the lateral bipolar transistor being formed according to the BiCMOS method and without additional steps relative to formation of vertical bipolar devices if provided in the same area.

To accomplish these and other advantages and benefits, a lateral bipolar transistor made according to this invention generally has the following features. An active base region is formed over a substrate of an opposite conductivity type. The active base region preferably is formed on an intervening buried region of the same conductivity type provided on the substrate. The active base region advantageously is formed as an epitaxial layer of monocrystalline semiconductor material doped with impurities of appropriate conductivity for the active base of the lateral bipolar transistor. Collector regions having unique architecture for a lateral bipolar transistor application, along with an emitter region, are formed in this same active base region.

The collector of the lateral bipolar transistor is provided by forming moderately doped collector well regions of a conductivity type opposite to that of the active base region which laterally bound an intervening active base region to provide an LPNP. The collector well generally, but not necessarily, is formed having a depth extending approximately through the entire thickness of the active base region until reaching the buried region. An emitter is provided including an emitter well region formed in the surface of the active base region at a location laterally between and spaced from the collector well regions. The collector and emitter further include conductive layers of the same conductivity type arranged at the surface of the active base region over the respective collector and emitter well regions. The doped conductive layers, preferably doped polysilicon, serve as a contact layer for the collector and emitter upon which further electrical contact layers can be formed, such as metal silicides. Doped polysilicon type conductive layers advantageously can be used as a source of dopant that is diffused into the active base region to form the emitter well region at the location laterally between the collector well regions, as well as to form highly doped shallow surface well regions in the collector well regions to provide a low resistance contact with the polysilicon conductive layers.

Although the present invention is equally applicable to forming either LPNPs or NPNs, significant performance enhancements have been observed in particular, where the invention is applied to fabrication of LPNPs. That is to say, an integrated circuit of one embodiment of this invention implements the unique moderately doped collector well region structures as P well regions of a collector of an LPNP, and the resulting circuitries are endowed with significantly enhanced performance capabilities. In particular, the product of the current gain and Early voltage is significantly increased due to the presence of the P well regions. Another advantage accruing from the provision of the P well regions of the present invention is that they effectively narrow the spacing between the emitter and collector, i.e., the base width, which helps to increase gain and frequency response. Additionally, the laterally spacing between the doped polysilicon portions of the emitter and collector is defined in this invention by a silicide protect layer formed on the polysilicon portions, instead of conventional LOCOS regions or oxide spacers, which further reduces the lateral spacing, and therefore the base width. Beta values for the LPNPs of this invention are greater than approximately 100, and generally about 100–150 and even higher. In any event, the LPNPs incorporating the unique P well regions in the collectors display a significant increase in the product of the current gain and the Early voltage. The increase in the product of the Early voltage and the current gain has been observed to be a factor as high as about 6 times the value associated with a similar structure except lacking the P well structures provided in the collectors according to the present invention.

Through this inventive lateral bipolar transistor architecture, the present invention defies the conventional wisdom regarding the offsetting tradeoff relationship expected to occur between changes in current gain and Early voltage in bipolar transistor circuitry. For instance, this means that the increases in current gain achieved by the inventive lateral bipolar transistors are not effectively cancelled out by losses in Early voltage, because only a relatively small reduction actually results in the Early voltage despite the huge increases in current gain. Consequently, the high product value of the current gain and Early voltage achieved in the lateral bipolar transistors of this invention facilitates the building of linear circuits. Also, all of the current gain, Early voltage and frequency response can be provided at relatively high values in the inventive lateral bipolar transistors to provide high speed performance.

Another important discovery embodied by the present invention is the determination that the thickness of an epitaxial layer used as the active base region has a notable impact on the frequency response of the circuit. In identifying this relationship, it has been determined that better response is found to be a positive function of the thickness of the epitaxial layer. By fabricating lateral PNPs with the above-mentioned inventive design precepts in mind, lateral PNPs according to the invention have gain at frequency up to 1 GHz.

Importantly, the lateral bipolar transistors of the present invention can be formed in the course of a BiCMOS process in an active area otherwise defined for a conventional vertical PNP device without increasing the number of process steps required.

BRIEF DESCRIPTION OF THE DRAWINGS

The foregoing and other objects, aspects and advantages of the present invention will be better understood from the following detailed description with reference to the drawings, in which:

FIGS. 1 to 10 illustrate enlarged, cross-sectional views of representative portions of a semiconductor structure at several different stages of a BiCMOS fabrication sequence which integrates the fabrication of a lateral bipolar transistor according to an embodiment of the present invention. Of these, FIGS. 6–8 also show CMOS devices formed on other areas of the substrate during the same BiCMOS process flow, while FIG. 10 shows an essentially completed LPNP device made in accordance with the invention.

It will be understood that the drawings are merely provided for illustrative purposes and that the depicted features therein are not necessarily drawn to scale.

DETAILED DESCRIPTION OF THE INVENTION

Figure 1:
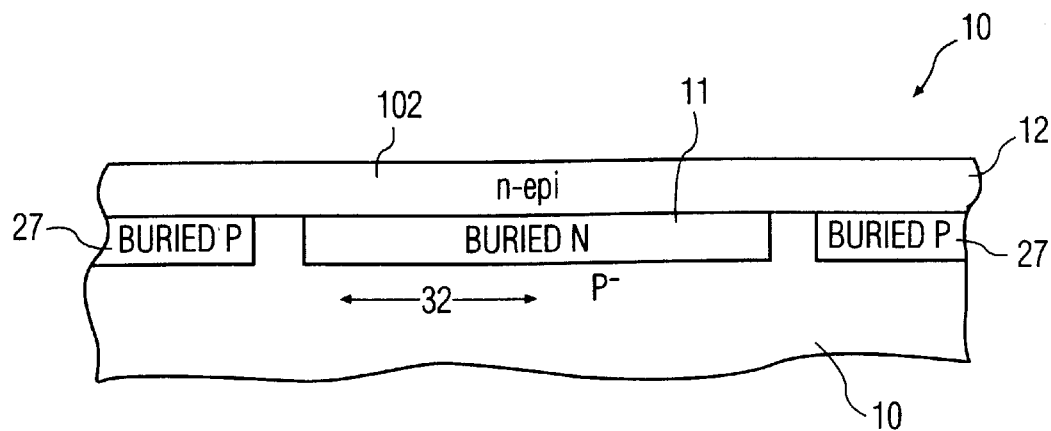

Referring to FIG. 1, the fabrication of a lateral bipolar PNP transistor of the invention can be carried out in accordance with a BiCMOS processing scheme including the following process sequence.

A mask, not shown, is provided on a lightly doped P type (P−) monocrystalline semiconductor substrate 10 to expose regions of the substrate to implantation of a high dose of arsenic (about $5E15/cm^2$), or other N-type impurity such as P or Sb, to form buried N regions 11 having a high N-type concentration in the exposed regions of the substrate 10. The monocrystalline substrate 10, for example, can be a silicon or GaAs wafer, or SOI, and so forth. The lateral or horizontal direction of the substrate and overlying layers formed thereon is indicated as direction 32. This implant step is used to form buried N regions for the LPNP to be fabricated as well as PMOS devices and NPN devices that will be located elsewhere on the substrate, as will become apparent from the discussion below in connection with FIGS. 6–7. This mask is stripped from the substrate 10, and then the substrate is annealed in oxygen.

A second mask, not shown, is provided on the wafer 10 to expose additional regions of the wafer to implantation with a medium dose of boron (about $4E13/cm^2$) to form buried P regions 27 having a conventional medium P type concentration in the exposed regions. The buried P regions 27 will form part of an isolation structure which will isolate the completed LPNP from adjacent devices. P-type buried regions are also formed in this step for NMOS devices to be located elsewhere on the substrate, as also will become apparent from the discussion below in connection with FIGS. 6–7. The second mask and an oxide layer are stripped off the surface of the substrate 10 by a standard HF etch.

Then, a lightly doped (about $1E16/cm^3$) N epitaxial layer (epi-layer) 12 of essentially uniform thickness of about 1 µm (1000 nm) of monosilicon is grown on the exposed surface of the substrate 10. The resulting intermediate structure is shown in FIG. 1. This resulting structure effectively serves as a substrate assembly 101 having an upper surface 102 available for further processing. The thickness of the epilayer 12 has been discovered to be critical as it has an impact on the frequency response of the completed LPNP, wherein better response has been found to be a direct function of increasing thickness of the epi-layer. Accordingly, epi-layer 12 thicknesses of about 1000 nm or greater are preferred.

Figure 2:
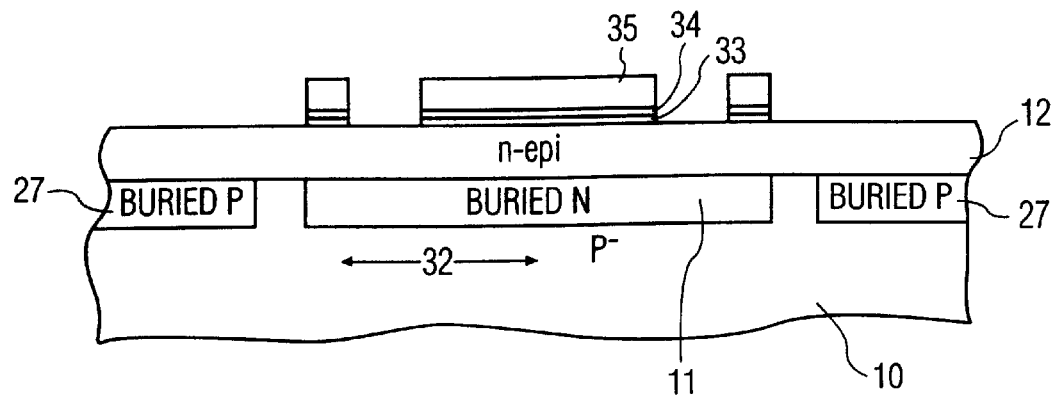

In order to provide field oxide defining the active area of the LPNP and isolation oxide around the LPNP, the following steps are followed. A thin pad oxide layer 33 of a thickness of about 15 nm is grown on the N type epitaxial layer 12 followed by the deposition of a 170 nm thick silicon nitride layer 34 by low pressure chemical vapor deposition (LPCVD). A third mask 35 is then applied to the define future active regions which are to be protected from the field oxidation to be performed. The active regions protected are areas of the buried N regions 11 which are used to provide a low resistance path below the devices. In any event, the nitride areas exposed by openings in the third mask are subjected to a reactive ion etching (RIE), which etches away the exposed nitride layer and the underlying oxide layer through about half of the thickness of the latter before the etch is halted. The resulting intermediate structure is shown in FIG. 2.

Figure 3:
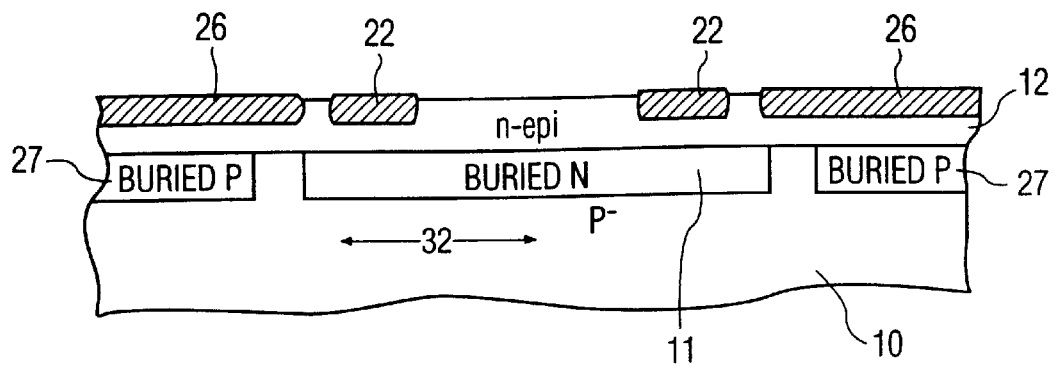

The third mask 35 is stripped away while leaving the underlying pattern of pad oxide 33 and nitride 34. A 550 nm layer of field oxide is thermally grown by oxidation in steam at 1050° C. on all areas not covered by the remaining patterned nitride layer to provide LOCOS regions 22, which define the active area within which the collector and emitter of the LPNP will be formed, and field oxide regions 26 over buried P regions 27. By use of wet etchants, a surface layer of oxide formed on the nitride layer during the oxidation, the nitride layer 34 and the pad oxide layer 33, are stripped away from the active areas. The resulting intermediate structure is shown in FIG. 3.

A sacrificial oxidation is then performed, which is carried out at 900° C. for 30 minutes (dry conditions), to form a thin field oxide layer, not shown, of a thickness of about 25 nm in the active areas.

An additional mask, not shown, is then provided to define locations where contacts for the LPNP ultimately are desired and to protect the rest of the active areas. Phosphorus is then implanted in the exposed active areas of N type epitaxial layer 12 located above the buried N regions 11 to form deep N type doped regions 23 in the epi-layer 12. N type regions 23 form a region of low resistance to the buried N regions 11. The mask used in forming the deep N type regions 23 is then stripped away and annealing is carried out, at 1000° C. in a nitrogen atmosphere, to cause the implanted phosphorus to diffuse into the buried N regions 11 and to link deep N regions 23 to the buried N regions 11

Figure 4:
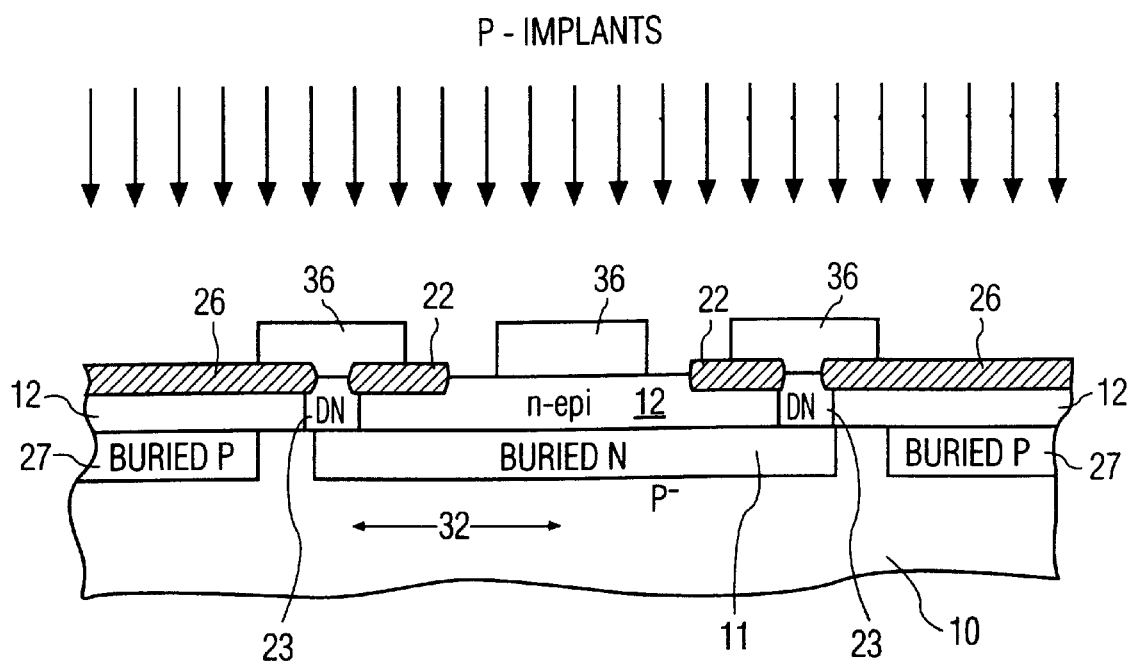

An implant mask 36 is then provided that is patterned to exposed areas of field oxide 26 where located above the buried P regions 27 and also locations within the active area defined by LOCOS 22 where collector regions are desired. As illustrated in FIG. 4, a triple step implant of boron with energies of 180, 90 and 25 keV, respectively, is then carrier out into the exposed areas of n-epi layer 12 (and field oxide 26) defined by mask 36. The step of implanting the impurities at the first implant energy is performed at about 180 KeV using a boron dose of $6E12$ atoms/$cm^2$. The step of implanting the impurities at the second implant energy is performed at about 90 KeV using a boron dose of $1E12$ atoms/$cm^2$. After completing the triple implant procedure, the implant mask 36 is stripped away and the sacrificial oxide layer is removed by a wet etch. This implant procedure is used to simultaneously form P-wells for NMOS transistors located elsewhere on the substrate.

Figure 5:
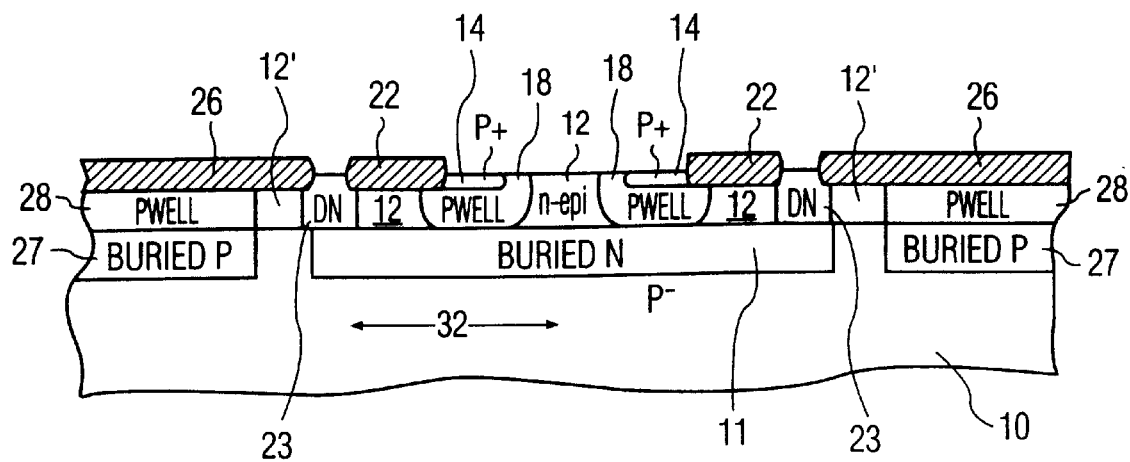

As illustrated in FIG. 5, the 180 KeV implant results in the formation of P-type well regions 28 above the buried P region 27, and also P-well regions 18 that isolate adjacent N type regions (in the N type epitaxy layer 12) from each other. P-well regions 18 have a depth extending through the thickness of epi-layer 12 and terminate where they reach buried region 11. Portions 12' of the n-epi layer 12 lie between P well 28 and the deep N regions 23. Buried P well regions 28 serve to isolate adjacent LPNP devices, while buried N regions are used for NPN devices and the lateral PNP.

The 90 KeV implant is used for anti-punchthrough, as it keeps the drain from shorting to the source on NMOS transistors being formed elsewhere on the substrate. The 25 KeV implant is used to set the threshold voltage of the NMOS transistors located elsewhere on the substrate, i.e., the gate voltage needed to turn on the transistor. After all three implants are performed, the P well regions 18 as shown in FIG. 5 are doped with boron at a peak dopant concentration of approximately 1E17 atoms/cm$^3$. The P well implants 18 laterally bound an intervening region 120 of the n-epi layer 12 to form a lateral PNP structure.

Figure 6:
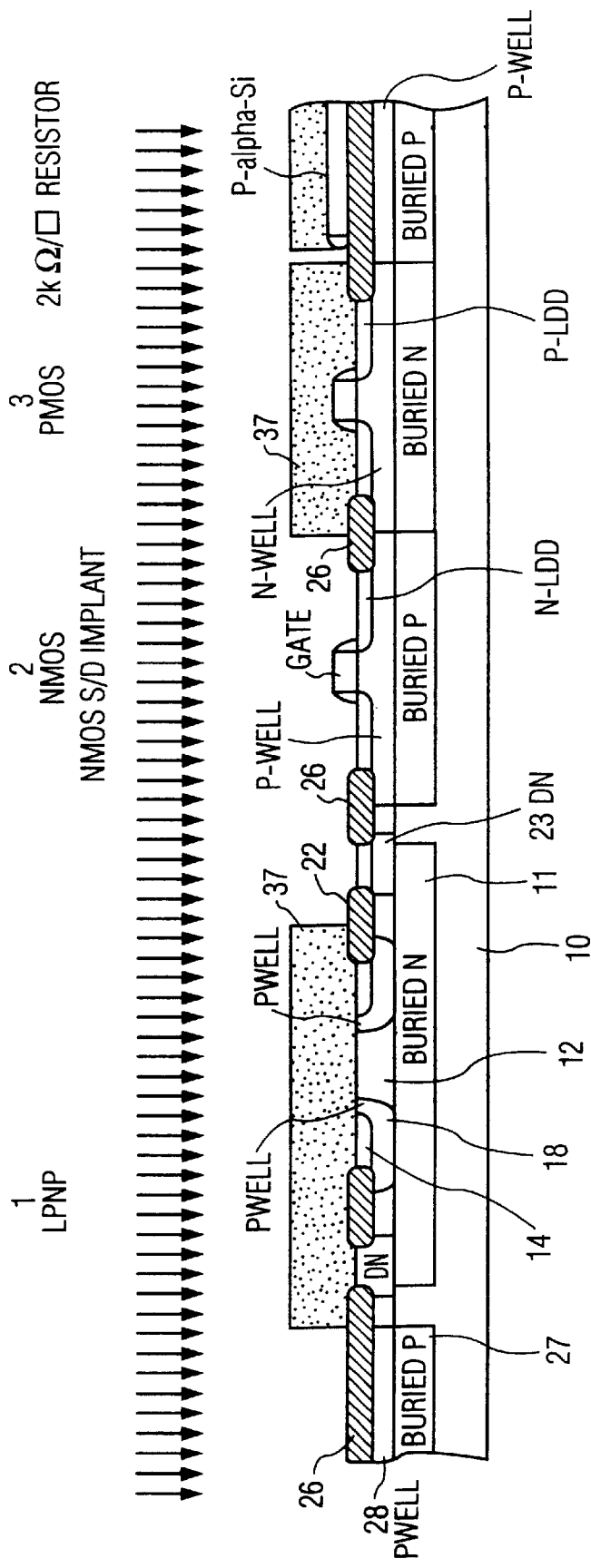
Figure 7:
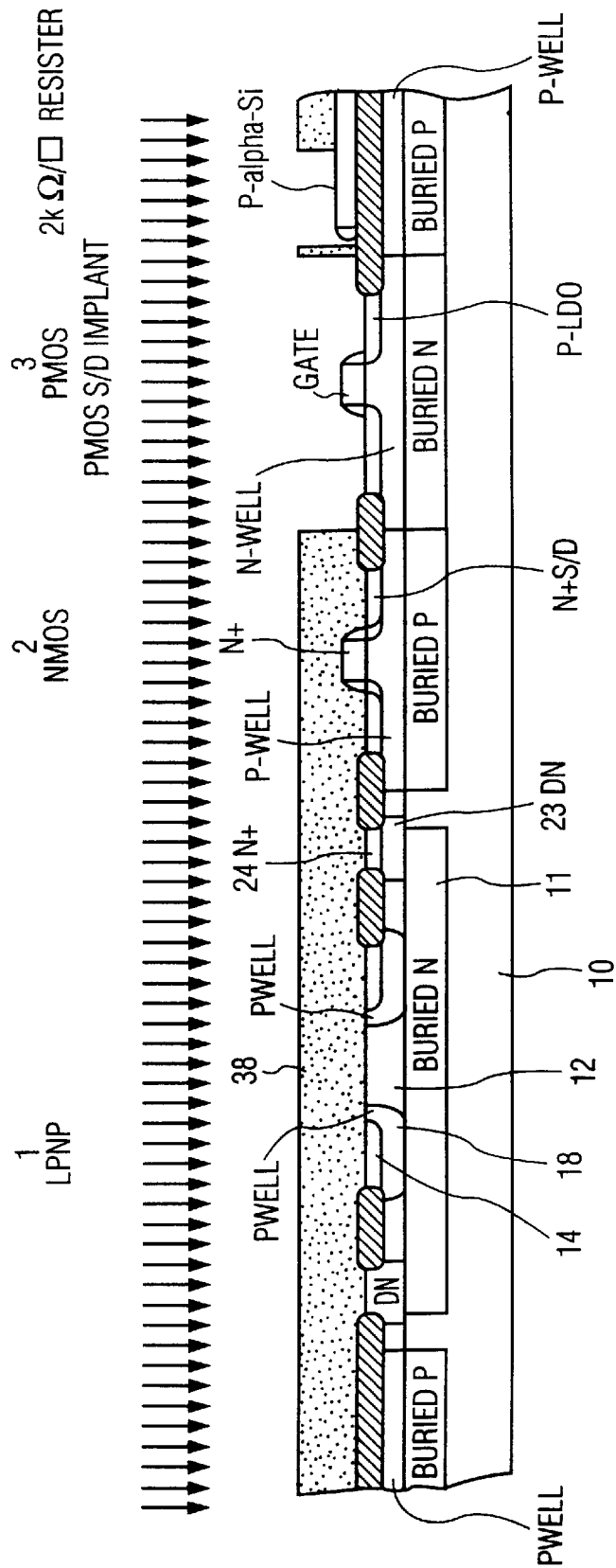

The P well implants 18, having moderate doping, provided in the collector regions increase the product of the Early voltage and the current gain significantly. This increase has been observed to be a factor of approximately 6 in LPNPs made according to the invention, as compared to a similar devices except without the P well implants provided in the collector regions. At this juncture in the BiCMOS process sequence, and as illustrated in FIGS. 6 and 7, CMOS devices are formed in other active areas 2 and 3 on the same substrate 10 by conventional CMOS process flow during which the LPNP active area 1 is masked. As illustrated in FIG. 6, after an NMOS P-well is formed during the above-described triple implant procedure, an NMOS poly gate is deposited on gate oxide and then patterned, followed by formation of an NMOS N-LDD, by conventional NMOS processing in active area 2, then a mask 37 is applied to expose areas of active area 2 where highly doped N-type external source/drain (S/D) regions are to be formed by implant. The mask 37 also exposes the deep N regions 23 (only) of the LPNP. An implant of arsenic is made through the exposed areas of mask 37 which forms the external S/D regions of the NMOS transistors. The arsenic implant through mask 37 also forms the external heavily doped (N+) base active region 24, which is located above the deep N type region 23, in order to provide a low resistance path to buried N region 11 and reduce collector series resistance. The mask 37 is removed and an annealment is performed. FIG. 6 also indicates a 2 kΩ/square polysilicon resistor that is formed by conventional procedures, typically as defined by RIE in the same polysilicon layer deposited for the NMOS and CMOS gates, and before sidewall oxide is grown on the CMOS gates.

As illustrated in FIG. 7, after a PMOS N-well, a PMOS poly gate on gate oxide, and PMOS P-LDD have been formed by conventional PMOS processing integrated with the NMOS processing and while the LPNP active area was masked, a mask 38 is applied to expose areas of active area 3 where highly doped P-type external source/drain (S/D) regions are to be formed. A P implant with boron is performed to form P+ S/D regions and the PMOS gate becomes doped P+. The mask 38 is removed and an annealment is performed. After forming the CMOS devices while the LPNP active area 1 was masked, the process flow then returns to continue the fabrication of the LPNP.

Figure 8:
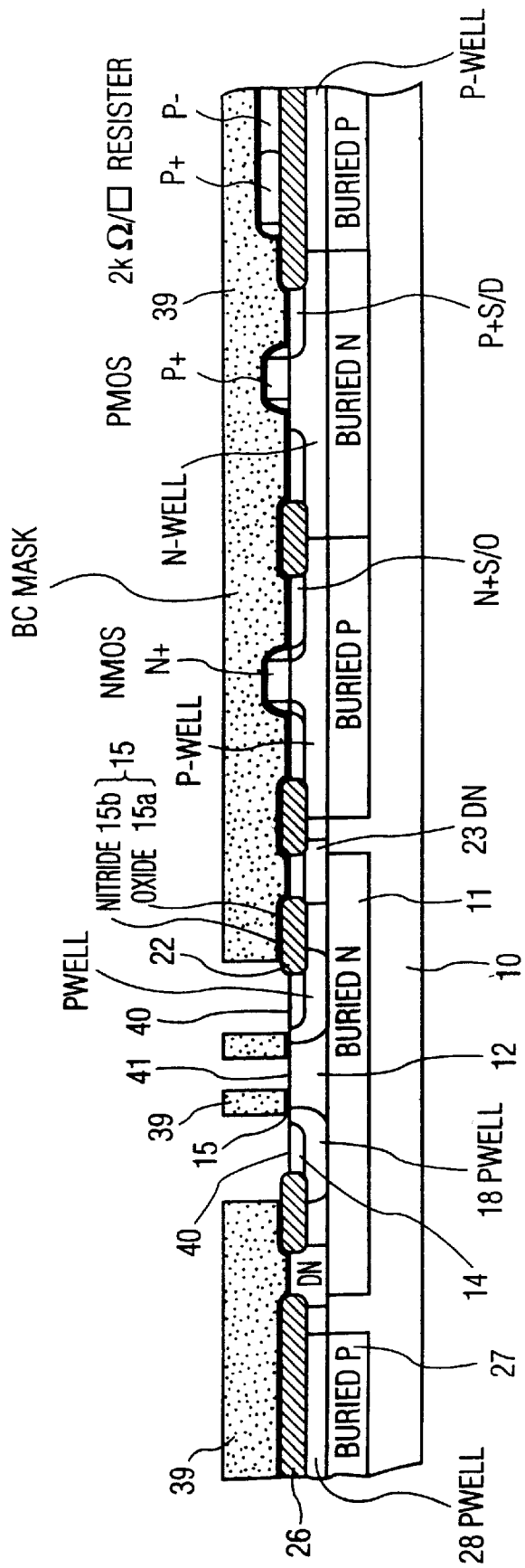

In returning to the fabrication of the LPNP device in particular, and referring to FIG. 8, a silicon dioxide layer 15a of a thickness of about 20 nm, which is formed by LPCVD from TEOS, and a silicon nitride layer 15b of a thickness of about 30 nm, which is formed by LPCVD, are sequentially grown in that order on the surface of the substrate assembly, which includes the surface of N epitaxial layer 12, to form a nitride/oxide stack 15 (e.g., a $Si_3N_4/SiO_2$ layers stack), i.e., a dielectric stack 15. A mask 39 is then applied which covers the areas (23, 24) of the LPNP and the CMOS devices. The mask 39 is patterned to expose the nitride/oxide stack 15 at locations above the desired collector and emitter areas. The resulting structure is shown in FIG. 8. Then, a RIE etch, which stops at the underlying silicon dioxide layer 15a, is used to remove the silicon nitride layer 15b where exposed. Then the exposed portions of the silicon dioxide layer 15a are removed by wet etch to provide exposed surface portions 40 and 41 of active base region 12, which will correspond to locations of the collector and emitter regions, respectively, in the completed LPNP. The mask 39 is removed. The description below focuses mainly on the process steps used to complete the fabrication of the LPNP device, and the CMOS devices generally will be protected during these final LPNP fabrication steps by at least the oxide/nitride stack 15 unless indicated otherwise below.

Figure 9:
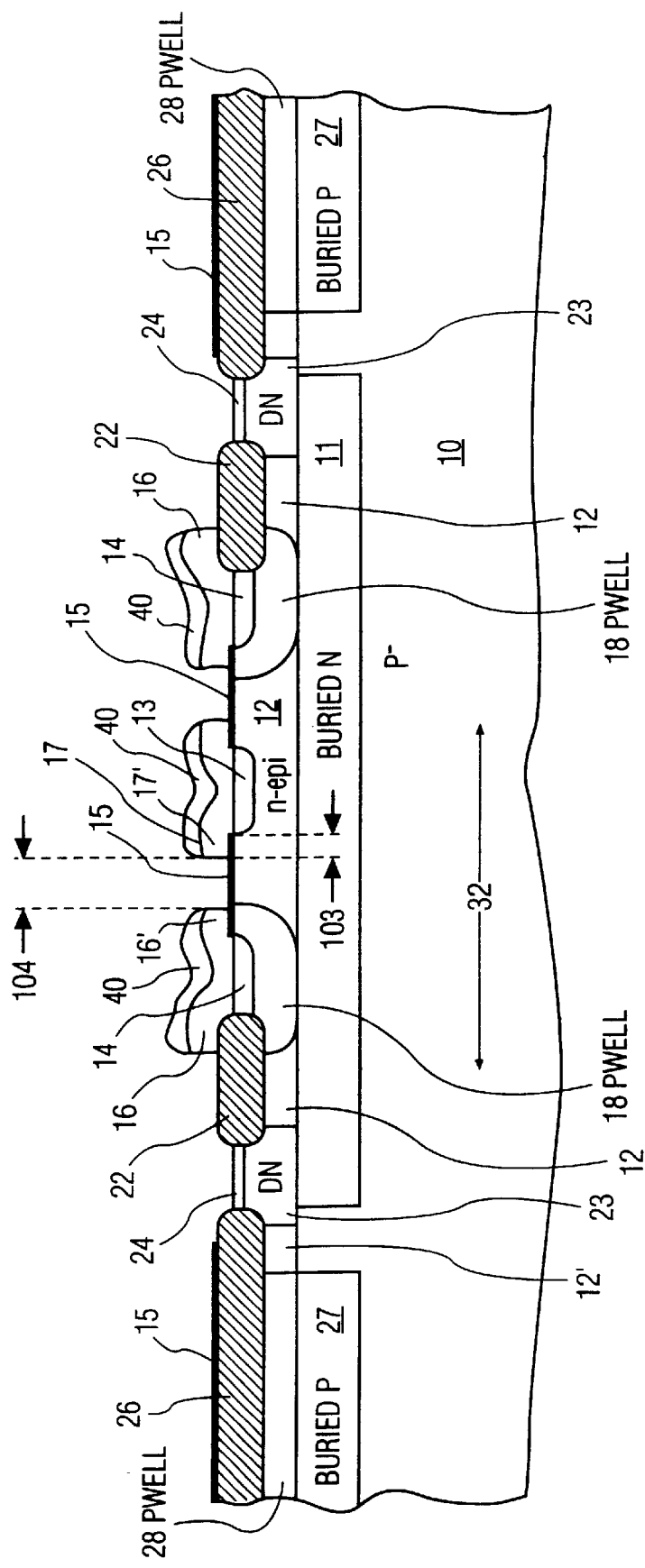

Referring now to FIG. 9, which depicts the LPNP device under fabrication, a polysilicon layer (16, 17) of a thickness of about 300 nm is then blanket deposited on the substrate assembly by a LPCVD method. This polysilicon layer (16, 17) directly contacts the active base region (epi-layer 12) at its exposed surface regions 40 and 41 where the openings were formed in the oxide/nitride stack 15 in the immediate previous steps. The deposited polysilicon layer (16, 17) is then made P+ by being heavily doped by boron by means of an implant that is sufficiently low in energy so that there is no increase in the doping concentration in the monosilicon material of the P well regions 18. A temporary silicon dioxide layer (not shown) of a thickness of about 200 nm is then grown on the polysilicon layer (16, 17) by LPCVD using TEOS as the reactant. This temporary silicon dioxide is removed after NPN emitter poly is defined and etched elswehere on the substrate. The wafer 10 is then annealed by heating at 850° C. in an oxygen atmosphere in a furnace followed by rapid thermal processing (RTP) at 1050° C. for 10 seconds in order to activate the boron dopant and distribute the boron dopant within the polysilicon layer (16, 17) and to diffuse boron dopant from the polysilicon layer (16, 17) down into n-epi layer 12 where exposed through stack 15. This diffusion forms a P+ well emitter region 13 in the epi-layer 12 at an exposed region thereof directly under polysilicon layer portion 17, and concurrently forms highly doped (P+) shallow surface regions 14 in the P type well regions 18 at exposed regions directly under polysilicon layer portion 16.

A resist mask, not shown, is used to pattern the P+ polysilicon to define the lateral borders of the polysilicon layer pattern (16, 17) to be used in the collector and emitter of the LPNP. The polysilicon layer will be removed everywhere else on the substrate where left unmasked.

However, before etching the polysilicon layer, oxide spacers may be left on the high topography steps, as oxide spacers tend to occur wherever the resist mask must bend to contour around underlying structures, such as NPN's, CMOS or poly lines. Therefore, first, a wet oxide etch is done which removes those oxide spacers from the polysilicon layer (16, 17), while CMOS and NPN devices formed elsewhere on the substrate are protected by the resist mask. This step prevents and eliminates any oxide spacers from occurring on the lateral sides of polysilicon layers 16 and 17.

Next the reactive ion etch is done to etch through all portions of the polysilicon layer where exposed (unmasked) and this etch stops on the remaining nitride layer 15b. Because of the high topography steps, an overetch of about 100% is needed to ensure that polysilicon spacers are removed. The resist mask is stripped off after the etch leaves polysilicon regions (16, 17) over the collector well 18 and emitter well 13. The resulting structure is shown in FIG. 9.

The resist mask used for patterning the polysilicon (16, 17) is defined appropriately to create a partial lateral overlap 103 between side portions (16', 17') of the polysilicon retained upon completion of the anisotropic etching with underlying lateral side portions of the nitride/oxide stack 15, as can be seen in FIG. 9. In this way, the lateral spacing 104, i.e., the base width, between the collector (18) and the emitter (13) is effectively reduced in the present invention as compared to a lateral bipolar PNP transistors retaining oxide spacers on lateral sides of the patterned polysilicon layer portions in the completed device. Since the remaining P+ polysilicon overlaps on the base contact openings, the emitter-base junction is field plated.

Figure 10:
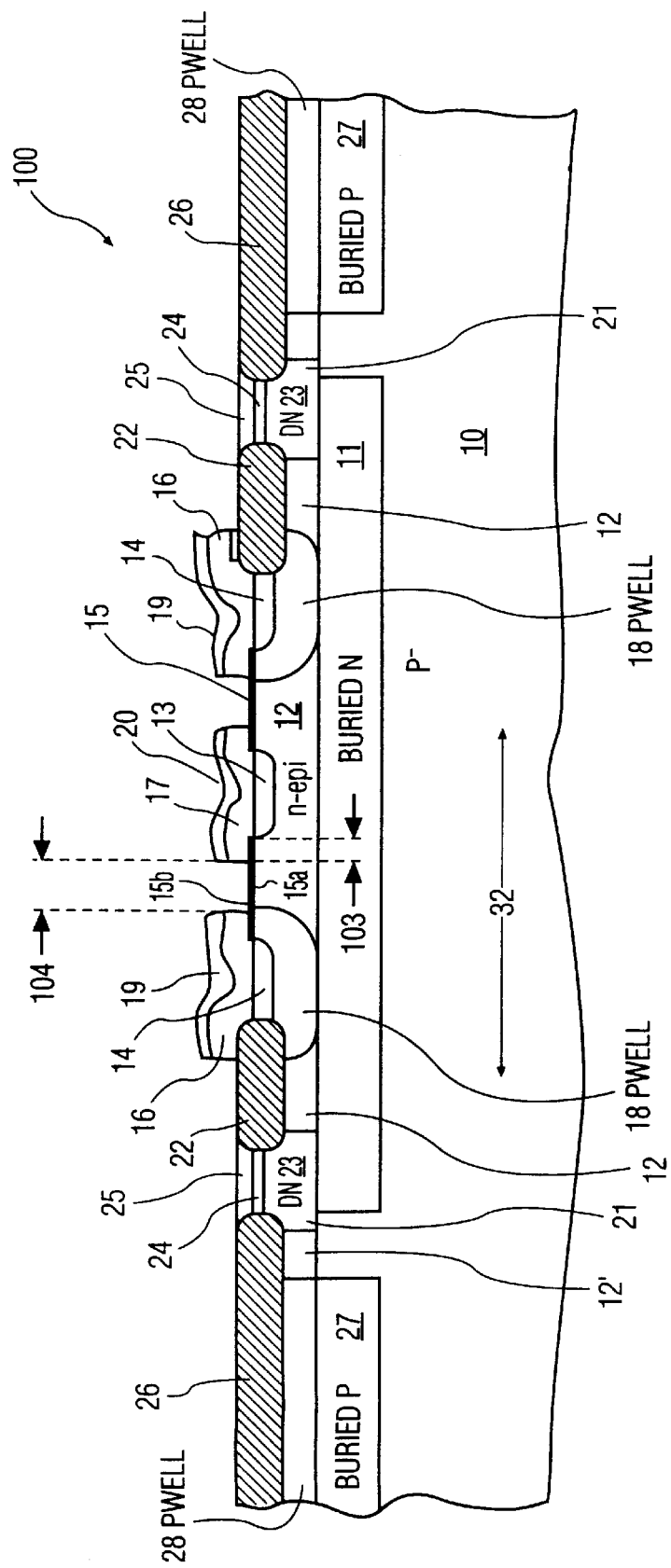

Next in the process flow, another resist mask 42, as shown in FIG. 10, is then used to define areas that should be silicided. That is, metal silicide formation is preferably used to provide low resistance contacts to the LPNP base, collector, and emitter. The resist mask 42 should be applied in areas between the collector (14, 16, 18) and the emitter (13, 17), and arranged to partially overlap the collector regions. This resist mask 42 prevents the oxide/nitride stack 15 from being etched on either side of the emitter P+ poly 17, which serves to block silicide formation in the active base region 12 of the LPNP. This prevents shorts form occuring between the collector and emitter. A reactive ion etch is performed that anisotropically etches away the remaining unmasked nitride 15b located outside the masked active area of the LPNP under fabrication and stops in the silicon dioxide layer 15a underneath of stack 15. After stripping the resist mask 42, a wet etch in dilute HF is used to remove the exposed portions of silicon dioxide 15a and native oxide on the P+ poly 17. All the areas that should not be silicided are protected from this etch by the nitride layer 15b remaining after the nitride etch. A Ti/TiN layer is then sputtered and subsequently rapid thermal processing (RTP) at about 700° C. is used to form $TiSi_2$ (19, 20, 25) on polysilicon areas (16, 17) and N+ base contact region 24 (as well as on CMOS gates and their S/D regions). The silicide 25 formed on the top of the heavily doped N type region 24, which, taken together with deep N type region 23, provides a base terminal 21 for the LPNP device.

Other useful metal silicides for this step, include, for example, tungsten silicide or cobalt disilicide. On areas that are covered by oxide the Ti does not react with the oxide. This unreacted Ti is removed by a wet etch (viz., $NH_4OH$, $H_2O_2$), which leaves the reacted Ti/TiN layer intact. In this way, a so-called salicide ("self-aligned silicide") is formed on all exposed polysilicon and monosilicon areas. Alternatively, instead of the Ti/TiN stack, a single layer of Ti could be used. A similar salicide can be obtained by sputtering Pt and using a different RTP temperature and wet etchant. In the case of $TiSi_2$ formation, a second RTP step at about 830° C. is widely used to transfer it from the C49 phase to the C54 phase, which has only 25% of the sheet resistance. The lateral spacing 104 between the collector (14, 16, 18) and the emitter (13, 17) is reduced by use of the inventive processing scheme in that the spacing is defined by the silicide protect layer instead of LOCOS.

By this juncture of the process flow, the "front-end" processing of the invention has been completed and the LPNP bipolar transistor is essentially completed. As to the "back-end" processing for formation of metal interconnections to the LPNP and other IC devices on the substrate, standard or any other appropriate metallization operations can be performed to provide multiple metallization levels as needed on the BiCMOS device. Before the metallization is performed, the LPNP and CMOS devices are coated with one or more a dielectric layers providing a planar upper surface. For example, after metal silicide formation, film of high-refractive index glass can be deposited by PECVD, followed by spinning on a layer of flowable oxide (FOX) such as hydrogensilesquioxane, and then capping with a layer of PECVD TEOS. Conductive interconnections are formed in electrical communication with silicided polysilicon regions 16 and 17 and the base contact 25 of the LPNP using standard or any other appropriate metallization procedures for such devices. The metallized device can be passivated by standard approaches. Passivation can be done by depositing a stack of phosphorus-doped glass and silicon nitride at low temperature on the fourth metal layer. Those having ordinary skill in the field will readily appreciate other suitable techniques for the back-end processing performed after the silicidation procedure.

Also, in a practical implementation of the invention, the lateral bipolar transistor is formed in a concentric configuration with the collector regions formed in the configuration of an outer annulus, the active base region formed in the configuration of a middle annulus inside the collector regions, and the emitter formed in an area located inside the middle annulus of the active base region. For instance, these annuli can form concentric squares, squares with rounded corners, and so forth. As a caveat, the collector of the LPNP device of this invention, in operation, cannot be forward biased. Under reverse bias, the potential of the emitter will repel hot carriers from the surface. This is important for the reliability of the LPNP since hot carriers can create interface states and reduce the current gain and increase the 1/f noise under forward operation. Typically, but not required necessarily depending on the application, the LPNP's made according to this invention are operated as common-emitter transistors.

The P well architectures provided in the LPNPs of this invention have been found to be responsible for significantly increasing the product of current gain and the Early voltage, such as by a factor of 6 or more. Beta values for the LPNPs of this invention are greater than approximately 100, and generally about 100–150. The P well regions also effectively narrow the spacing between the emitter and collector, i.e., the base width, which helps to increase gain and frequency response. Additionally, the laterally spacing between the doped polysilicon portions of the emitter and collector is defined in this invention by a silicide protect layer formed on the polysilicon portions, instead of conventional LOCOS regions or oxide spacers, which further reduces the lateral spacing, and therefore the base width. The lateral PNP's according to this invention have a gain at frequency up to 1 GHz. BiCMOS circuits incorporating the lateral bipolar transistors of this invention may comprise both PNP and NPN bipolar transistors, as well as CMOS transistors including NMOS and PMOS transistors, as formed in separate active areas defined over the common substrate.

While the present invention is described herein with reference to an illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility. For instance, the conductivity types of the regions, layers and substrate can be reversed to form lateral N-P-N instead of lateral P-N-P bipolar transistors illustrated.

It is therefore intended by the appended claims to cover any and all such applications, modifications and embodiments within the scope of the present invention.

What is claimed is:

1. An integrated circuit having a lateral bipolar transistor and at least one CMOS device, comprising:

a substrate of a first conductivity type;

an active base region of a second conductivity type over the substrate, the second conductivity type being opposite the first conductivity type;

a collector comprising first well regions of the first conductivity type located in the active base region and laterally bounding an intervening region of the active base region, and a first conductive layer of the first conductivity type on the first well regions, wherein the first well regions include respective shallow surface well regions of the first conductivity type having la higher conductivity; and an emitter comprising a second well region located in the active base region at a location laterally between and spaced from the first well regions, and a second conductive layer of the first conductivity type on the second well region, wherein, said first conductive layer of the first conductivity type and said second conductive layer of the first conductivity type comprise a lateral spacing that is defined by a silicide protect layer and said lateral spacing is smaller than the lateral spacing between said first well region and said second well region.

2. The integrated circuit according to claim 1, wherein the first and second conductivity types are P-type and N-type, respectively.

3. The integrated circuit according to claim 1, wherein the lateral bipolar transistor is formed in a concentric configuration with the collector regions formed in the configuration of an outer annulus, the active base region formed in the configuration of a middle annulus inside the collector regions, and the emitter formed in an area located inside the middle annulus of the active base region.

4. The integrated circuit according to claim 1, wherein the first well regions are doped with boron.

5. The integrated circuit according to claim 1, wherein the first well regions at portions other than the surface regions of higher conductivity are doped with boron at a peak dopant concentration of approximately 1E17 atoms/cm$^3$.

6. The integrated circuit according to claim 1, wherein the active base region comprises an epitaxial layer doped with an impurity selected from the group consisting of arsenic, antimony, and phosphorus.

7. The integrated circuit according to claim 1, wherein the active base region is an epitaxial layer having a thickness of approximately 1000 nm or greater.

8. The integrated circuit according to claim 1, wherein the first and second conductive layers comprise doped polysilicon layers.

9. The integrated circuit according to claim 1, further comprising a buried region of high conductivity of the second conductivity type located between the active base region and the substrate, and wherein the first well regions extend downward to approximately reach the buried region.

10. An integrated circuit having a lateral bipolar transistor and at least one CMOS device, comprising:

a P-type substrate;

a buried N region on the substrate;

an N-type epitaxial layer on the buried N region;

a collector comprising first P well regions located in the epitaxial layer and laterally bounding an intervening region of the epitaxial layer, a first P-type conductive layer on the first P well regions, and wherein the first P well regions include respective shallow surface well regions of higher conductivity; and an emitter comprising a second P well region located in the surface of the epitaxial base layer at a location laterally between and spaced from the first P well regions, and a second P-type conductive layer on the second well region, wherein said first conductive layer of the first conductivity type and said second conductive layer the first conductivity type comprise a lateral spacing that is defined by a silicide protect layer and said lateral spacing is smaller than the lateral spacing between said first well region and said second well region.

11. The integrated circuit according to claim 10, wherein the lateral bipolar transistor is formed in a concentric configuration with the collector regions formed in the configuration of an outer annulus, the epitaxial layer formed in the configuration of a middle annulus inside the collector regions, and the emitter formed in an area located inside the middle annulus of the epitaxial layer.

12. The integrated circuit according to claim 10, wherein the first well regions at portions other than the surface regions of higher conductivity are doped with boron at a peak dopant concentration of approximately 1E17 atoms/cm$^3$.

13. The integrated circuit according to claim 10, wherein the epitaxial layer has a thickness of approximately 1000 nm or greater.

14. The integrated circuit according to claim 10, wherein first and second conductive layers comprise P-doped polysilicon layers having exposed polysilicon sidewalls free of oxide spacers.

15. The integrated circuit according to claim 10, further comprising a first electrical contact layer comprising a conductive silicide on the first P-type conductive layer and a second electrical contact layer comprising a conductive silicide on the second P-type conductive layer.

16. The integrated circuit according to claim 10, wherein the lateral bipolar transistor is formed on the substrate within a first active region bounded by isolation oxide.

17. The integrated circuit according to claim 10, wherein the lateral bipolar transistor is formed on the substrate within a first active area, and further comprising, on the substrate, a second active area within which CMOS transistors have been formed, wherein the first and second active areas are laterally separated on the substrate by an intervening field insulation region.

18. The integrated circuit according to claim 10, further comprising:

a nitride/oxide stack comprising a silicon oxide sublayer and a silicon nitride sublayer on said N-type epitaxial layer, where the stack laterally extends along the surface of the epitaxial layer between said emitter and said collector and overlaps the emitter region and collector regions sufficient to have lateral stack edges that abut a lateral side of the second P well region of the emitter at one stack edge and the shallow surface well regions of the collector at the other stack edge;

a base terminal separated horizontally from said emitter and collector by LOCOS regions, the base terminal comprising a deep N type layer on said buried N region and a N+ region on said deep N type layer, and electrically conductive contacts made to said base terminal via said N+ region;

a buried P region on said substrate at a location laterally spaced from the buried N region on said substrate and laterally outside the base terminal;

a P type well layer on said buried P region; and a field oxide layer on said a P type well region.

* * * * *